United States Patent
Sharma et al.

(10) Patent No.: US 12,372,580 B2
(45) Date of Patent: Jul. 29, 2025

(54) SYSTEMS AND METHODS FOR MANAGING DIVERSE BATTERIES

(71) Applicants: Ratnesh Kumar Sharma, Fremont, CA (US); Surinder Singh, Fremont, CA (US)

(72) Inventors: Ratnesh Kumar Sharma, Fremont, CA (US); Surinder Singh, Fremont, CA (US)

(73) Assignee: Relyion, Inc., Fremont, CA (US)

( * ) Notice: Subject to any disclaimer, the term of this patent is extended or adjusted under 35 U.S.C. 154(b) by 0 days.

(21) Appl. No.: 17/705,471

(22) Filed: Mar. 28, 2022

(65) Prior Publication Data

US 2023/0305064 A1 Sep. 28, 2023

(51) Int. Cl.
| | |
|---|---|
| *G01R 31/367* | (2019.01) |
| *G01R 31/374* | (2019.01) |
| *G01R 31/3842* | (2019.01) |
| *G06F 17/18* | (2006.01) |
| *H02J 7/00* | (2006.01) |

(52) U.S. Cl.
CPC ......... *G01R 31/367* (2019.01); *G01R 31/374* (2019.01); *G01R 31/3842* (2019.01); *H02J 7/0013* (2013.01); *H02J 7/0047* (2013.01); *G06F 17/18* (2013.01)

(58) Field of Classification Search
CPC G01R 31/367; G01R 31/374; G01R 31/3842; H02J 7/0013; H02J 7/0047; G06F 17/18
See application file for complete search history.

(56) References Cited

U.S. PATENT DOCUMENTS

| | | | |
|---|---|---|---|
| 2018/0191175 A1* | 7/2018 | Hsieh | H02J 7/0016 |
| 2018/0345818 A1* | 12/2018 | Frost | B60L 53/14 |
| 2019/0277917 A1* | 9/2019 | Chan | G01R 31/3835 |
| 2020/0144830 A1 | 5/2020 | Muenzel et al. | |
| 2021/0249702 A1 | 8/2021 | Murphy et al. | |
| 2021/0265710 A1 | 8/2021 | Muenzel et al. | |
| 2021/0333328 A1 | 10/2021 | Chung et al. | |
| 2022/0344959 A1* | 10/2022 | Sharma | H02J 7/007182 |
| 2022/0368150 A1* | 11/2022 | Sharma | H02J 7/007184 |

(Continued)

FOREIGN PATENT DOCUMENTS

| | | | | | |
|---|---|---|---|---|---|
| CN | 106443482 | A | * | 2/2017 | G01R 31/367 |
| CN | 113978311 | A | * | 1/2022 | B60L 58/10 |

(Continued)

OTHER PUBLICATIONS

Hein et al., "A capacity-based equalization method for aged lithium-ion batteries in electric vehicles" Electric Power Systems Research 191 (2021) 106898 (Year: 2021).*

(Continued)

*Primary Examiner* — John C Kuan
(74) *Attorney, Agent, or Firm* — PatentPC; Bao Tran

(57) ABSTRACT

Systems and methods are disclosed for controlling packs of rechargeable batteries by: for each pack: determining electrical characteristics of the pack; determining energy correction for the pack; calculating a voltage correction for the pack; and determining a dispatch modifier for the pack. The system then normalizes the dispatch modifiers for all packs and recalculates the dispatch modifiers for all packs.

19 Claims, 12 Drawing Sheets

(56) References Cited

U.S. PATENT DOCUMENTS

| | | | |
|---|---|---|---|
| 2023/0117104 A1* | 4/2023 | Sharma | B60L 55/00 |
| | | | 320/109 |
| 2023/0119821 A1* | 4/2023 | Sharma | H02J 7/00032 |
| | | | 320/124 |
| 2023/0126838 A1* | 4/2023 | Sharma | H02J 7/0048 |
| | | | 307/82 |

FOREIGN PATENT DOCUMENTS

| | | | | |
|---|---|---|---|---|
| EP | 3667207 A1 * | 6/2020 | | B60H 1/32 |
| WO | WO-2007006121 A1 * | 1/2007 | | B60L 11/1861 |

OTHER PUBLICATIONS

Machine translation for CN-113978311-A (Year: 2024).*

* cited by examiner

SYSTEMS AND METHODS FOR MANAGING DIVERSE BATTERIES

BACKGROUND

Li-ion batteries are in high demand due to their "energy density". Energy density is the amount of energy a system can store in a given space. While lithium batteries are lighter and more portable than other types, they can still hold the same amount of energy. This has led to a rapid rise in consumer adoption of small, portable, and cordless devices.

Many products use lithium-ion (Liion) batteries, including electronics, toys and handheld power tools. However, after long usage, these batteries lose the ability to perform energy storage in accordance with their specifications, and the controller can no longer work with them. As a result, these products must either replace the batteries or entire products are discarded. They can be harmful to the environment and human health if they are not managed properly at the end.

Conventional systems have tried to estimate the State of Health (SOH) of degraded batteries. There have been various methods for estimating the remaining capacity of cells like EIS. Various methods have been developed to segregate "good" and "bad" cells including ultrasound techniques. and then operated batteries as usual based on that information. Some methods use a system of switches to bypass under-performing cells.

U.S. application No. 20210333328 discloses that an electrochemical storage diagnostic system can be configured to perform an electrical test to measure energy storage device parameters. The diagnostic system includes a charge management controller, electrically coupled to a power multiplexer, a power converter circuit, and an isolated converter circuit. The charge management controller is programmed with instructions to identify a device under test, selected from at least one member of the plurality of energy storage devices to perform an electrical test.

U.S. application No. 20210249702 discloses that each test platform performs ultrasonic scans of batteries. During the scans, each test platform can place pressure upon and measure temperature and open circuit voltages of each battery, transmit ultrasound signals into each battery and generate transmitted signal data in response, detect ultrasound signals reflected by or transmitted through each battery in response to the transmitted ultrasound signals and generate received signal data in response. The processing system can quantify aspects of the signal data and present the aspects to one or more battery models, which compute and assign a state of charge (SOC) and a state of health (SOH) to each battery in response. For example, the processing system can be in a service provider network that receives and analyzes signal data sent from test platforms at different customer facilities.

U.S. application No. 20200144830 describes a method to manage a pack of cells that utilizes switches to connect or bypass the underperforming cell units, unlocking additional charge and discharge capacity can be unlocked from the other cell units. Some disadvantages of current systems using this approach are that for each cell unit connected in series, an additional switch is placed in any given current path contributing an associated on resistance and energy loss. U.S. application No. 20210265710 similarly describes a switching assembly that can be configured to selectively connect or bypass each one of the battery cell units.

SUMMARY

In one aspect, systems and methods are disclosed for controlling packs of rechargeable batteries by: for each pack: determining electrical characteristics of the pack; determining energy correction for the pack; calculating a voltage correction for the pack; and determining a dispatch modifier for the pack. The system then normalizes the dispatch modifiers for all packs and recalculates the dispatch modifiers for all packs.

In another aspect, systems and methods are disclosed for controlling packs of rechargeable batteries by: for each pack: determining electrical characteristics of the pack; determining energy correction for the pack; calculating a voltage correction for the pack; generating a model as a learning machine or a statistical analyzer to estimate a power draw or a slope; applying the model to determine a dispatch modifier for the pack; normalizing the dispatch modifiers for all packs; and recalculating the dispatch modifiers for all packs.

In yet another aspect, a system includes one or more packs of rechargeable batteries; a controller coupled to the one or more packs for controlling packs of rechargeable batteries, wherein for each pack the controller determines electrical characteristics of the pack; determines energy correction for the pack; calculates a voltage correction for the pack; determines a dispatch modifier for the pack; the controller further normalizes the dispatch modifiers for all packs and recalculates the dispatch modifiers for all packs.

Advantages of the present system may include one or more of the following. The system considers the change in voltage current characteristics to determine appropriate charging/discharging management. Charge/discharge management is essential for continued performance of the degraded battery. This system addresses discharge management to improve the life performance of degraded/used battery modules. For example, the system sends dispatch commands to the battery modules that are throttled based on current draw and voltage drop caused. New batteries have a constant voltage profile during most of operating range. Used/degraded batteries demonstrate a drop in voltage due to initial losses at the electrodes and the throttling enables used/degraded batteries to be operational.

DESCRIPTION

Figure 1:
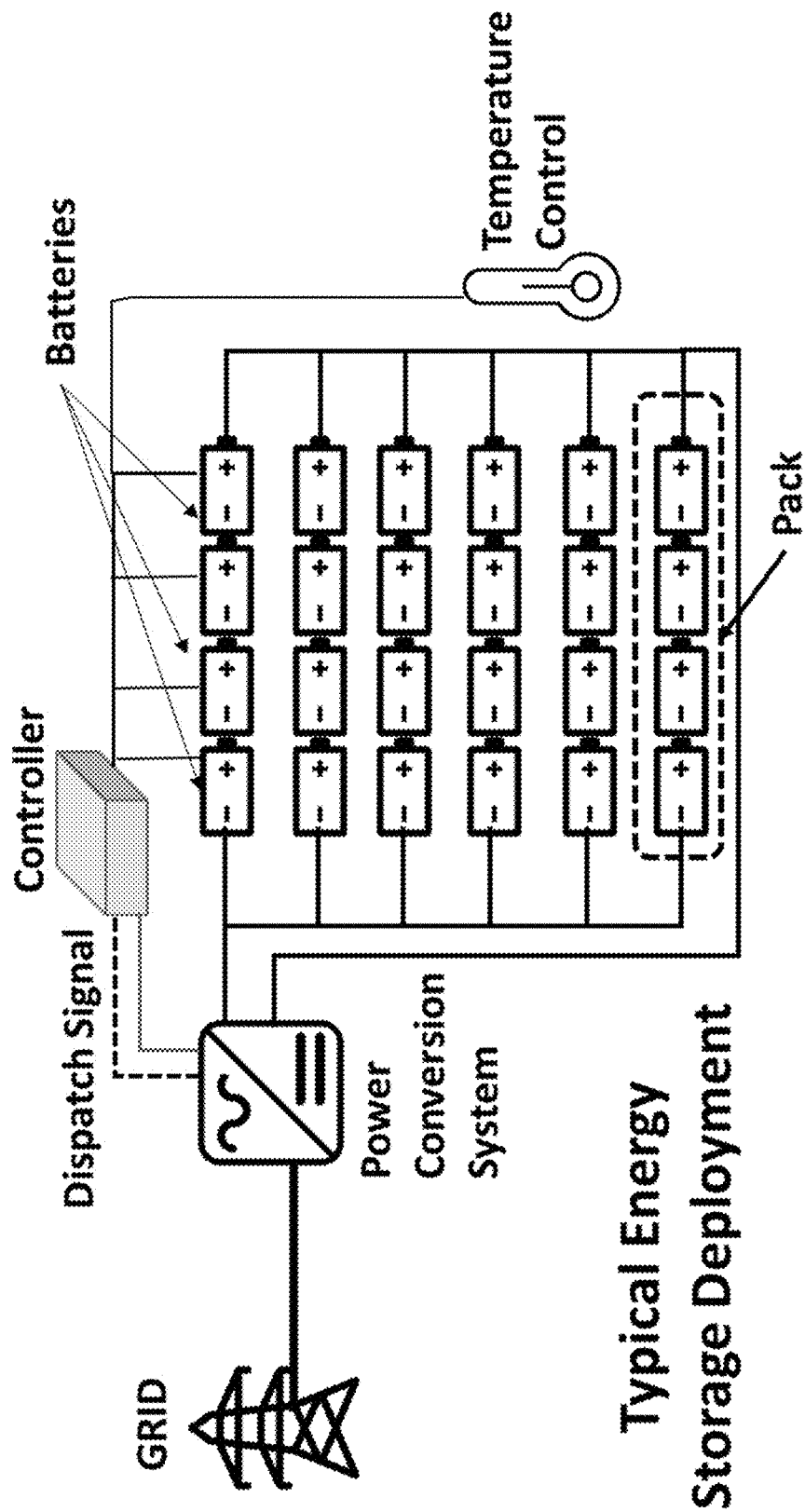
FIG. 1 shows an exemplary energy storage system with packs of batteries.

As shown in FIG. 1, a typical energy storage system deployment includes two subsystems (A) Power Conversion System and (B) Energy Storage System. the Energy Storage System consists of multitude of batteries arranged in packs of various or identical sizes connected in parallel or series or both. New batteries discharge/charge around a constant voltage during normal operation since the rate of electrochemical reaction can easily keep up with the electrical demand or the desired rate of flow of charge. In degraded or used batteries, however, the rate of electrochemical reaction cannot keep with the electrical demand, thus leading to drop in voltage during normal operation. This makes the task of managing battery packs difficult and complicated. Polarization effects reduce the performance of batteries displacing the electrode potential from the equilibrium value. Accumulation of gases (or other non-reagent products) at the interface between electrode and electrolyte lead to drop in voltage. Uneven depletion of reagents leads to concentration gradients in the electrolyte-electrode interface that impede the flow of ions. Such effects also lead to generation of heat and further affect the performance of the batteries. Eventually the cell potential reduces, reaction slows and stops prematurely.

Figure 2:
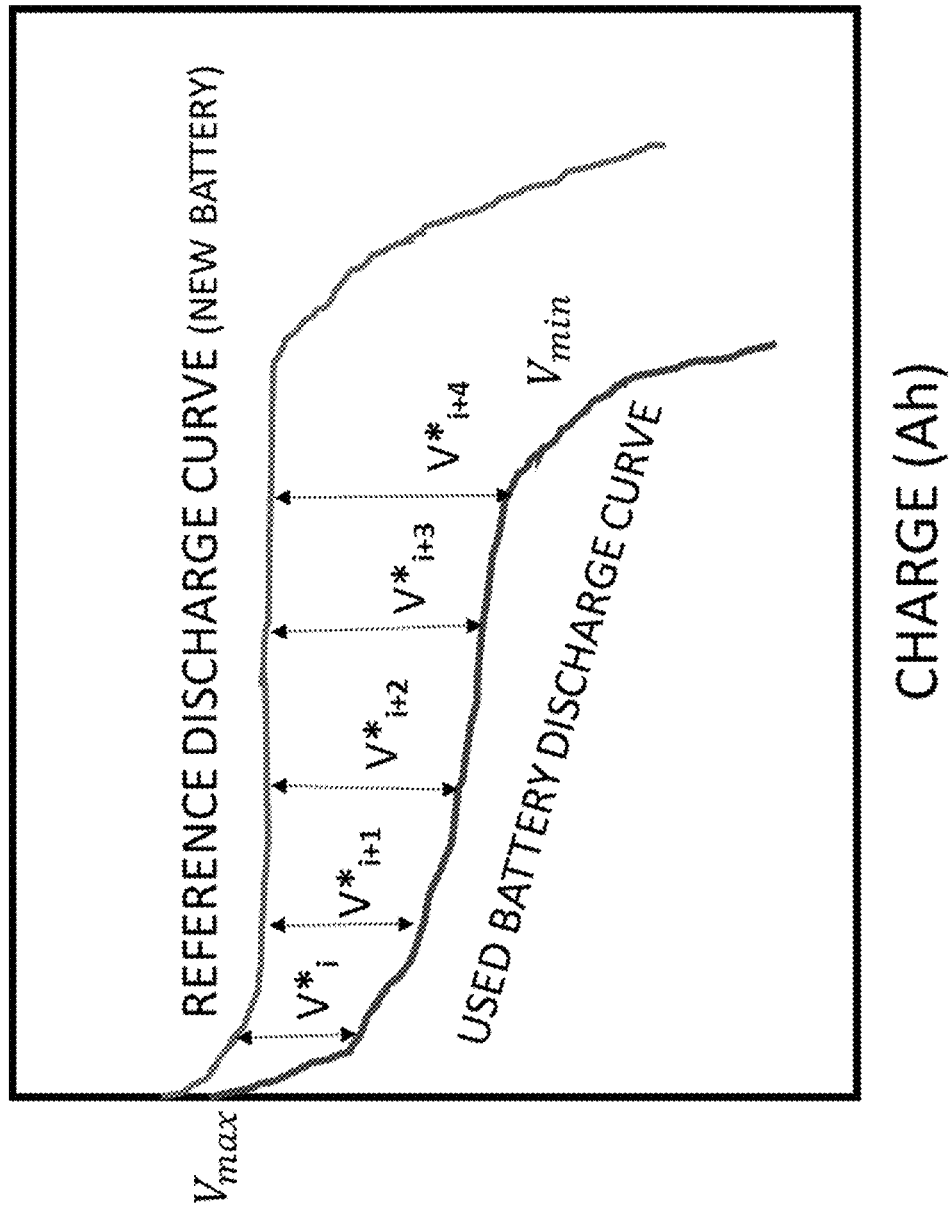
FIGS. 2-4 illustrate exemplary voltage/current relationships for a selected battery chemistry and illustrations of the slope calculation.
Figure 3:
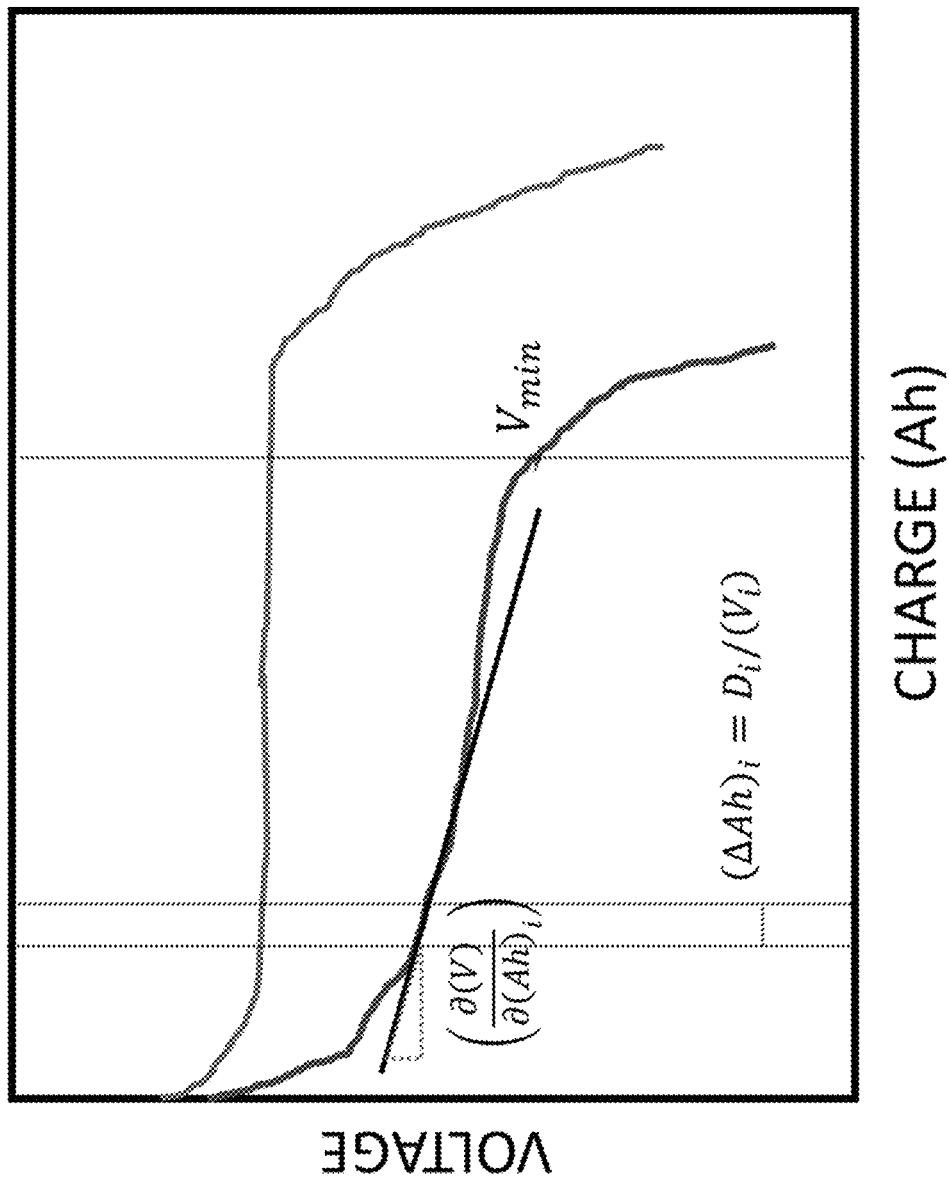
Figure 4:
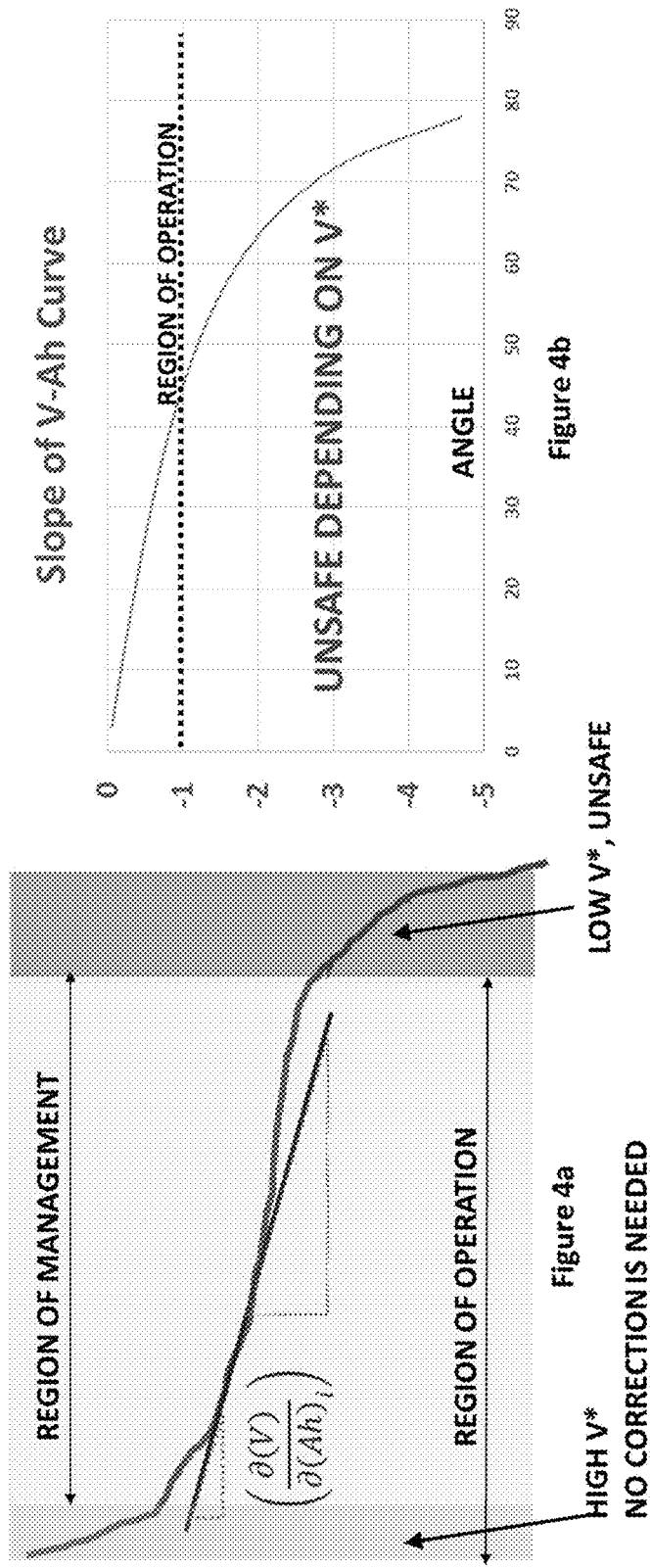

FIGS. 2-4 illustrate exemplary voltage/current relationships for a selected battery chemistry. Any battery used or new, has a voltage current characteristic curve that defines how the battery will perform when an external voltage is applied to it or an external load is connected to it. FIG. 1 shows a typical discharge curve with voltage on Y-axis and product of current flow and time elapsed on the X-axis. The battery has a voltage $V_{max}$ when its fully charged and a minimum voltage beyond which it should not be discharge ($V_{min}$). Typically for new batteries the curve is flat with high voltage drop in the beginning and end of discharge. The voltage value corresponding to this flat curve is referred to as Vref. In absence of measured values, this maybe considered to be the nominal voltage $V_{nom}$. For used batteries, however, the voltage shows gradual drop in voltage during normal process of discharge. To benchmark such cases, we need to obtain a reference curve as shown in FIG. 2. The used battery voltage can be parametrized in terms of this reference voltage curve using the following equation $$(V_i)^* = V_i/V_{ref,i} \quad (1)$$

A voltage range is calculated using the equation below $$V_{max} - V_{min} = (\Delta V_i)_{max} \quad (2)$$

Once a battery pack is brought online the battery voltage (Vi) is measured and equation (1) is used to calculate the dimensionless voltage for the current time. The dispatch signal to discharge power ($D_i$) is obtained. Using equation (3), the required Amp hour $(\Delta Ah)_i$ is calculated $$(\Delta Ah)_i = D_i/(V_i) \quad (3)$$

The slope of the discharge curve is calculated equation (4) where i represents the index in time (typically 1 min or other user defined time interval)

$$S = \left(\frac{\partial (V)_i}{\partial (Ah)_i}\right) = \left(\frac{V_i - V_{i-1}}{Ah_i - Ah_{i-1}}\right) \quad (4)$$

FIG. 3 shows an illustration of the slope calculation.

Above the nominal voltage $V_{nom}$, the slope of the curve is ignored and no correction is needed while the battery system continues operation unimpeded. However, if the voltage is equal to or below $V_{nom}$, the discharge needs to be managed. FIG. 3/4 describes this region of management on the battery characteristic curve. Typically a slope of −1 can be considered a threshold and operation below it is considered unsafe.

While these conditions are met and a safe region of operation is ascertained, the drop in voltage is calculated with the slope and required Amp hour for the $i_{th}$ time index using equation 5

$$(\Delta V_i) = \left(\frac{\partial (V)}{\partial (Ah)_i}\right)(\Delta Ah)_i \quad (5)$$

The drop in voltage is normalized using the voltage range obtained from equation (2) as shown below $$(\Delta V_i)^* = \left(\frac{(\Delta V_i)}{(\Delta V_i)_{max}}\right) \quad (6)$$

A modifier for the dispatch signal ($D_i$) is calculated based on the parameters calculated using the following equation $$M(V_i, Ah_i) = D_i((\Delta V_i)^*)(1 - V_i^*) \quad (7)$$

The modifier throttles the operation of the battery based on its current operating characteristics and its immediate past performance. The following equation is used to generate the final battery dispatch signal $\hat{D}_i$ $$\hat{D}_i = D_i + M(V_i, Ah_i) \quad (8)$$

For a new battery, the slope of the curve in FIG. 1 is relatively flat in the region of management, so the modifier is zero. For a depleted battery, the slope of the curve is high, which increases the modifier significantly.

While this approach determines the modified dispatch for a single pack, an aggregation of n packs can be managed based on the modifier for each pack. If $M_j$ is the modifier for the $j_{th}$ pack, it can be normalized with other packs using the following equation $$M_j^* = \frac{M_j}{\sum_{j=1}^n M_j} \quad (9)$$

This will ensure that the overall dispatch of the energy storage system is not compromised based on use of sub-optimal performing battery packs.

Sample Calculations of Typical Scenarios
  $D_i$=10000 W
  $(V_i)$=400V
  $(V_i)_{ref}$=500V
  $M(V_i, Ah_i)$=−1250
  $\hat{D}_i$=8750 W
New Battery

---

$(V_i)^* = 1$ $\left(\frac{\partial (V)}{\partial (Ah)_i}\right) = 0$ $M(V_i, Ah_i) = D_i((\Delta V_i)^*)(1 - V_i^*) = 0$

---

Used Battery

---

$(V_i)^* = 0.8$ $\left(\frac{\partial (V)}{\partial (Ah)_i}\right) = -0.5$ Region of Safe Operation > −1.0

-continued $$(\Delta Ah)_i = \frac{D_i}{(V_i)} = \frac{10000}{400} = 25$$

$$(\Delta V_i) = -12.5 \text{ V} \qquad (\Delta V_i)_{max} = 20 \text{ V}$$

$$(\Delta V_i)^* = \left(\frac{(\Delta V_i)}{(\Delta V_i)_{max}}\right) = \frac{-12.5}{20} = -0.625$$

$$M(V_i, Ah_i) = D_i((\Delta V_i)^*)(1 - V_i^*) = 10000 * (-0.625) * (0.2)$$
$$M(V_i, Ah_i) = -1250$$

$D_i$=10000 W
$(V_i)$=400V
$(V_i)_{ref}$=500V
$M(V_i, Ah_i)$=−625
$\hat{D}_i$=10000−625=9375 W
New Battery $$(V_i)^* = 1$$

$$\left(\frac{\partial(V)}{\partial(Ah)_i}\right) = 0$$

$$M(V_i, Ah_i) = D_i((\Delta V_i)^*)(1 - V_i^*) = 0$$

Used Battery $$(V_i)^* = 0.8$$

$$\left(\frac{\partial(V)}{\partial(Ah)_i}\right) = -0.25 \text{ Region of Safe Operation} > -1.0$$

$$(\Delta Ah)_i = \frac{D_i}{(V_i)} = \frac{10000}{400} = 25$$

$$(\Delta V_i) = -6.25 \text{ V} \qquad (\Delta V_i)_{max} = 20 \text{ V}$$

$$(\Delta V_i)^* = \left(\frac{(\Delta V_i)}{(\Delta V_i)_{max}}\right) = \frac{-6.25}{20} = -0.3125$$

$$M(V_i, Ah_i) = D_i((\Delta V_i)^*)(1 - V_i^*) = 10000 * (-0.3125) * (0.2)$$
$$M(V_i, Ah_i) = -625$$

$D_i$=12000 W
$(V_i)$=400V
$(V_i)_{ref}$=500V
$M(V_i, Ah_i)$=−1800
$\hat{D}_i$=12000−1800=10200 W
New Battery $$(V_i)^* = 1$$

$$\left(\frac{\partial(V)}{\partial(Ah)_i}\right) = 0$$

$$M(V_i, Ah_i) = D_i((\Delta V_i)^*)(1 - V_i^*) = 0$$

Used Battery $$(V_i)^* = 0.8$$

$$\left(\frac{\partial(V)}{\partial(Ah)_i}\right) = -0.5 \text{ Region of Safe Operation} > -1.0$$

$$(\Delta Ah)_i = \frac{D_i}{(V_i)} = \frac{12000}{400} = 30$$

$$(\Delta V_i) = -15 \text{ V} \qquad (\Delta V_i)_{max} = 20 \text{ V}$$

$$(\Delta V_i)^* = \left(\frac{(\Delta V_i)}{(\Delta V_i)_{max}}\right) = \frac{-15}{20} = -0.75$$

$$M(V_i, Ah_i) = D_i((\Delta V_i)^*)(1 - V_i^*) = 12000 * (-0.75) * (0.2)$$
$$M(V_i, Ah_i) = -1800$$

Figure 5:
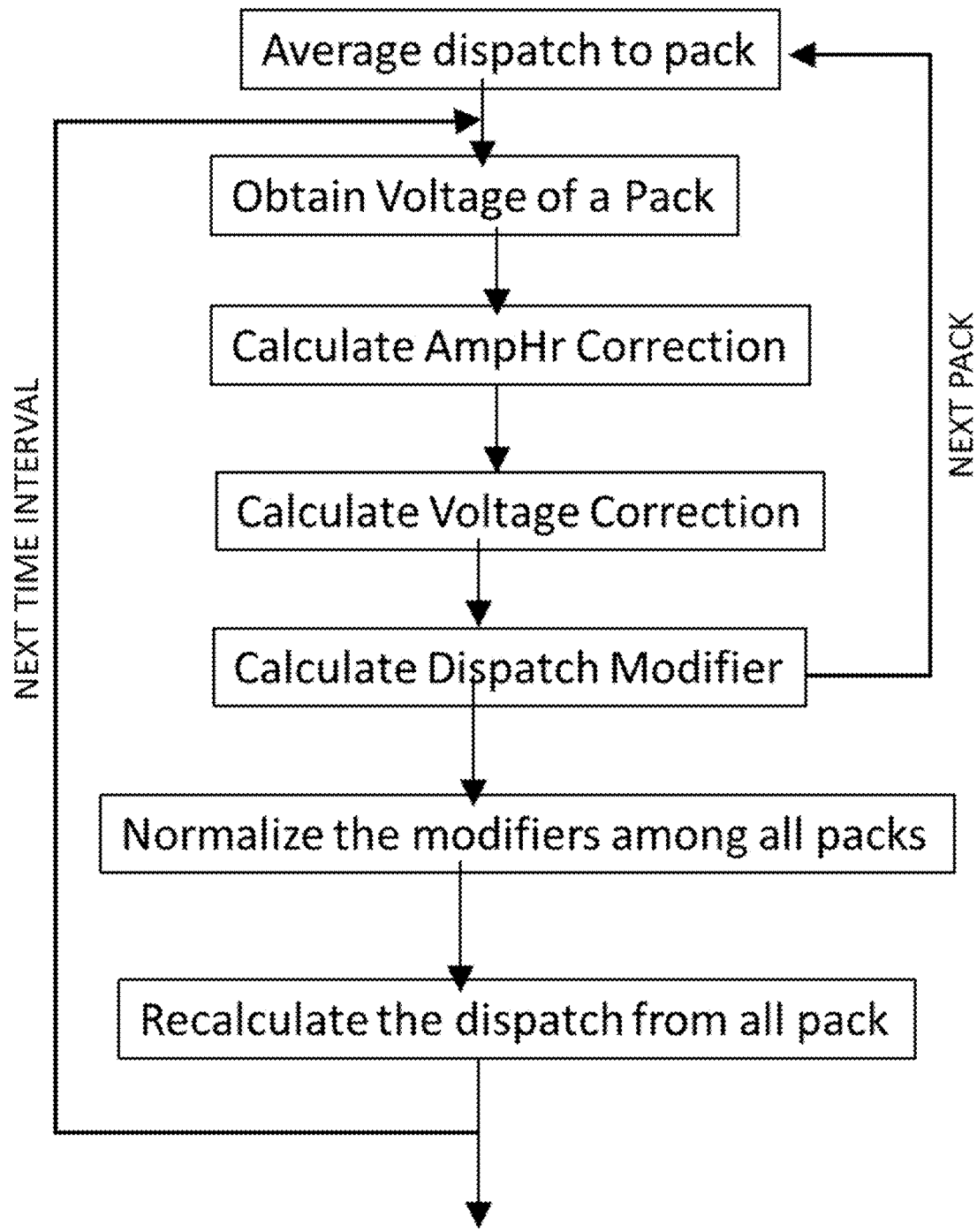
FIG. 5 shows a flow chart for an exemplary battery control system.

FIG. 5 shows a flow chart for an exemplary battery control system. In this system, the controller or processor/CPU receives an average dispatch to a battery pack. Through appropriate voltage/current sensors, the controller determines the voltage/current of the battery. The controller then runs a method for controlling packs of rechargeable batteries by:
for each pack:
  determining electrical characteristics of the pack;
  determining energy (AmpHr) correction for the pack;
  calculating a voltage correction for the pack;
  determining a dispatch modifier for the pack;
normalizing the dispatch modifiers for all packs; and
recalculating the dispatch modifiers for all packs.

An ampere hour or amp hour (AmpHr) is a unit of electric charge, having dimensions of electric current multiplied by time, equal to the charge transferred by a steady current of one ampere flowing for one hour, or 3,600 coulombs. For example, the commonly seen milliampere hour (mAh) is one-thousandth of an ampere hour (3.6 coulombs).

In another embodiment, Equation 9 can be further modified to consider temperature of the packs. If $T_j$ is the temperature of $j^{th}$ pack with prescribed desirable, high and low limit values as $T_{j,mean}$, $T_{j,h}$ and $T_{j,l}$, then a normalized temperature can be defined in the following equation $$T_j^* = \frac{T_j - T_{j,mean}}{T_{j,h} - T_{j,l}} \tag{10}$$

Figure 6:
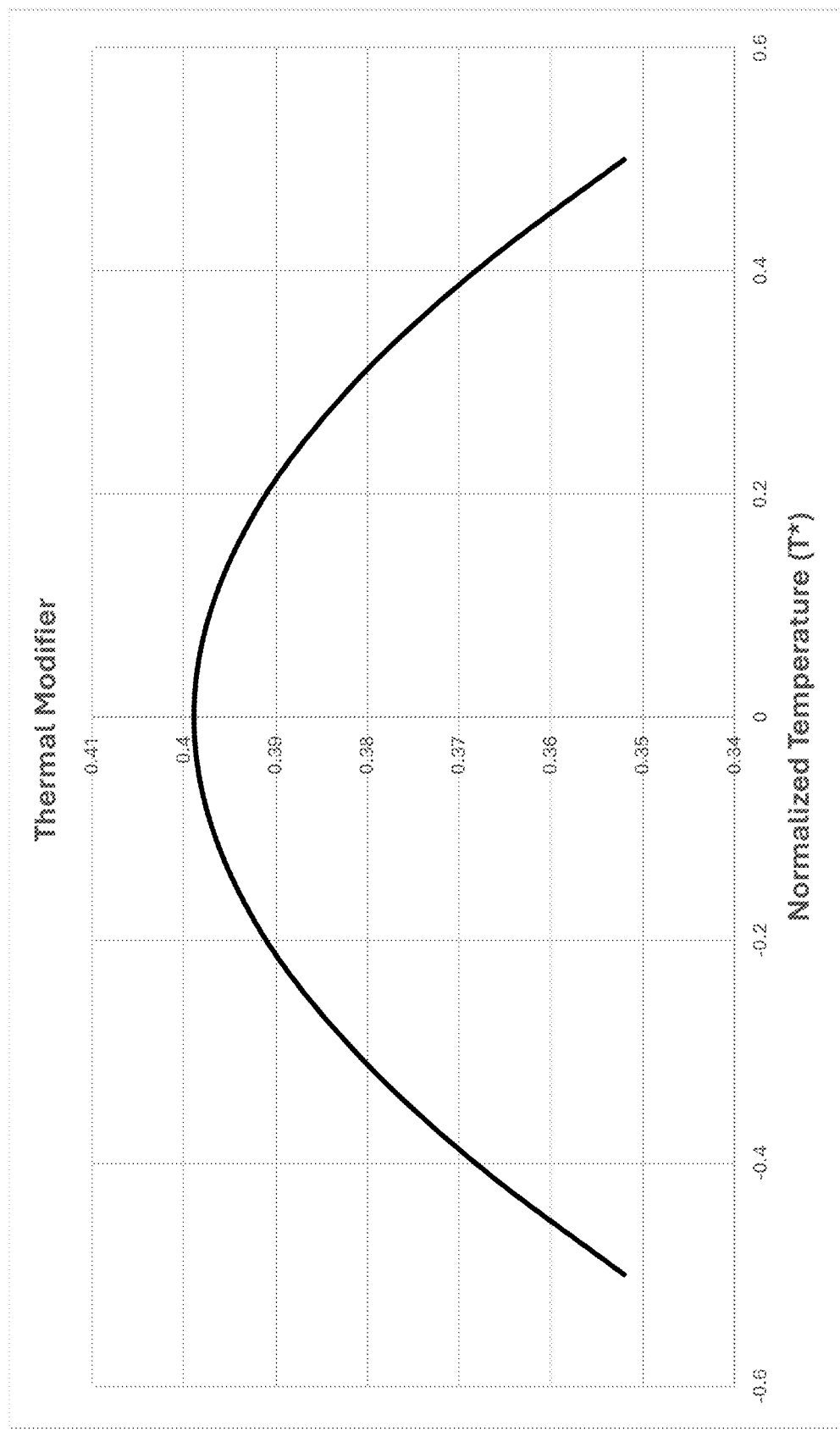
FIG. 6 shows an exemplary thermal modifier graph.

A thermal modifier ($M_{T,j}$) is a gaussian function of Tj* can be defined as follows a standard normal curve as defined in the graph of FIG. 6

$$M_{T,j} = \frac{e^{-\frac{(T_j^*)^2}{2}}}{\sqrt{2\pi}} \tag{11}$$

For a single pack in $i_{th}$ time interval, equation (7) can be modified as follows using the thermal modifier $$M(V_i, Ah_i) = D_i((\Delta V_i)^*)(1-V_i)(M_{T,i}) \tag{12}$$

For a energy storage systems with N packs, modifier obtained in eqn (12) can be used to calculate the $M_j^*$ biased with temperature correction using eqn (9).

Figure 7:
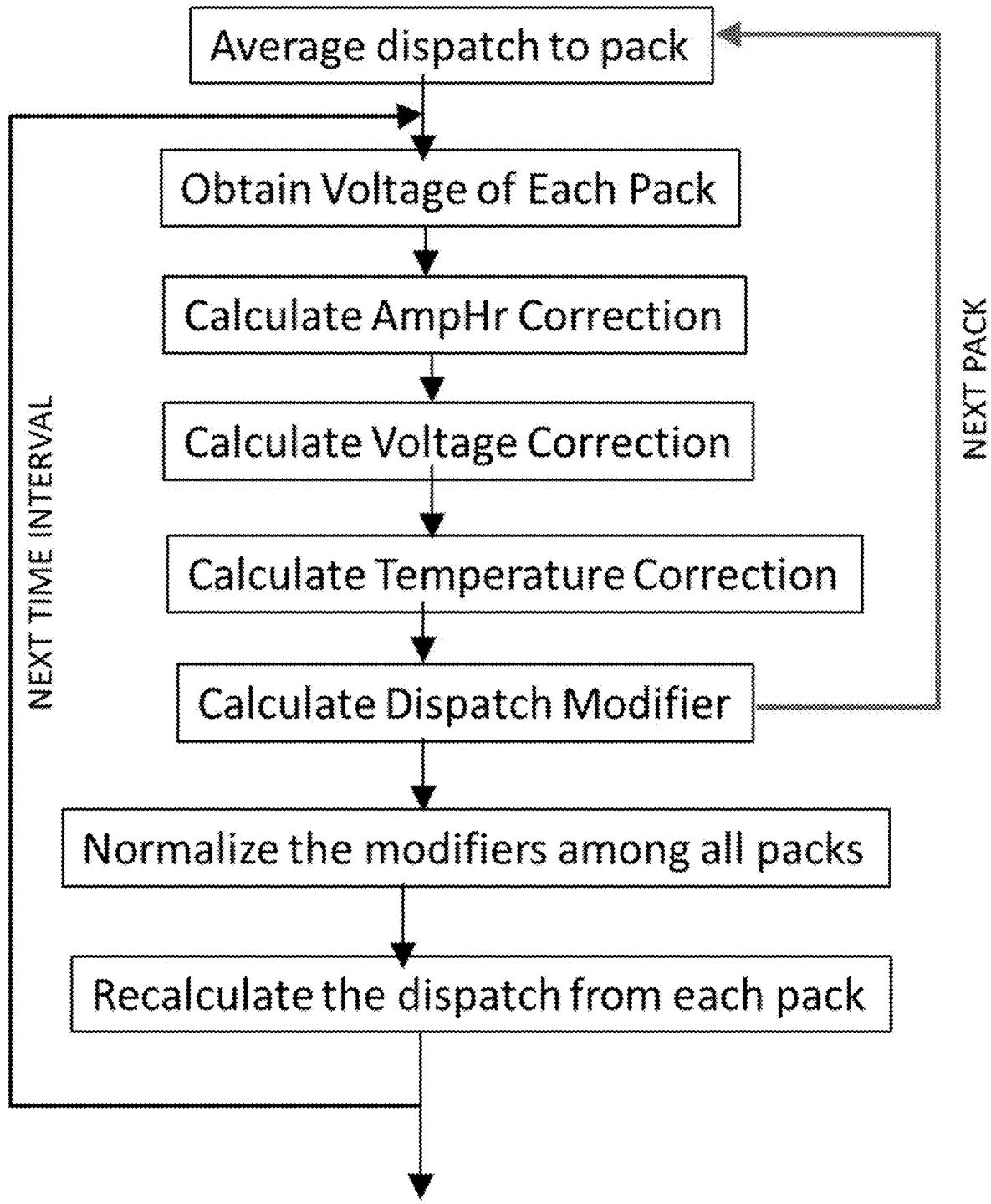
FIG. 7 shows a flow chart for an exemplary battery control system with temperature management.

As temperature can significantly influence battery performance, FIG. 7 shows a flow chart of one embodiment with a temperature corrected modifier. The controller then runs a method for controlling packs of rechargeable batteries by:
for each pack:
  determining electrical characteristics of the pack;
  determining energy (AmpHr) correction for the pack;

calculating a voltage correction for the pack;
determining a dispatch modifier for the pack;
normalizing the dispatch modifiers for all packs; and
recalculating the dispatch modifiers for all packs.

Figure 8A:
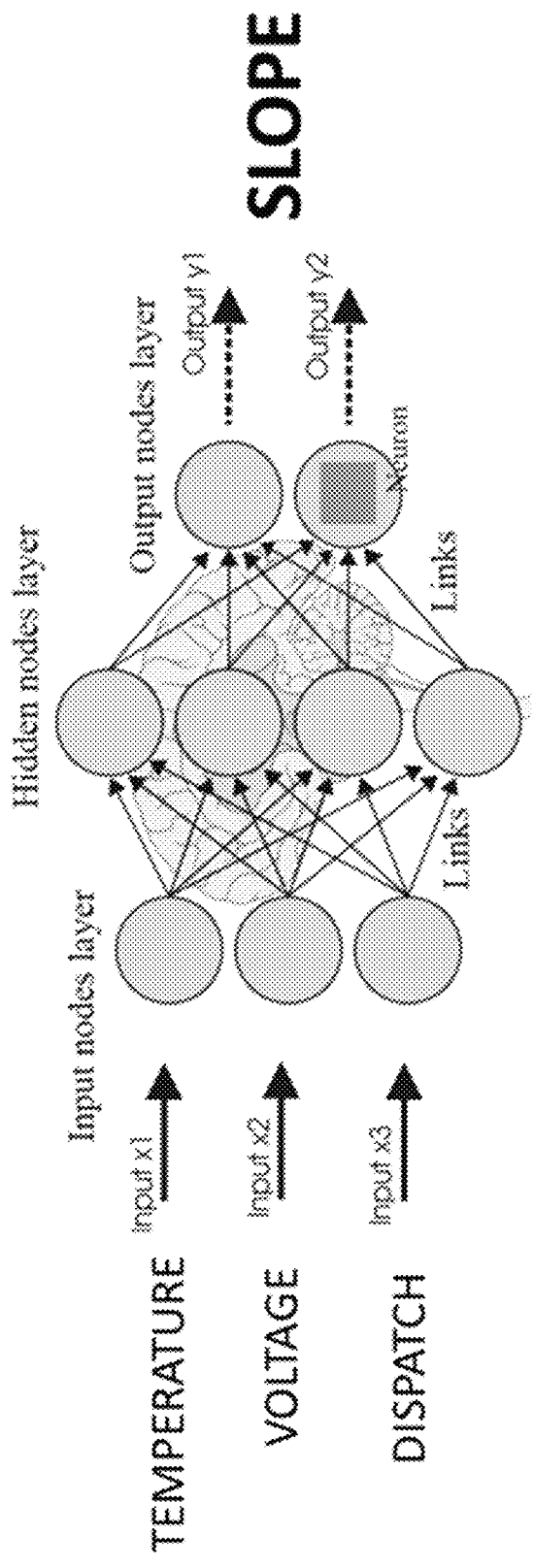
FIGS. 8A-8C show exemplary machine architectures for a battery control system.
Figure 8B:
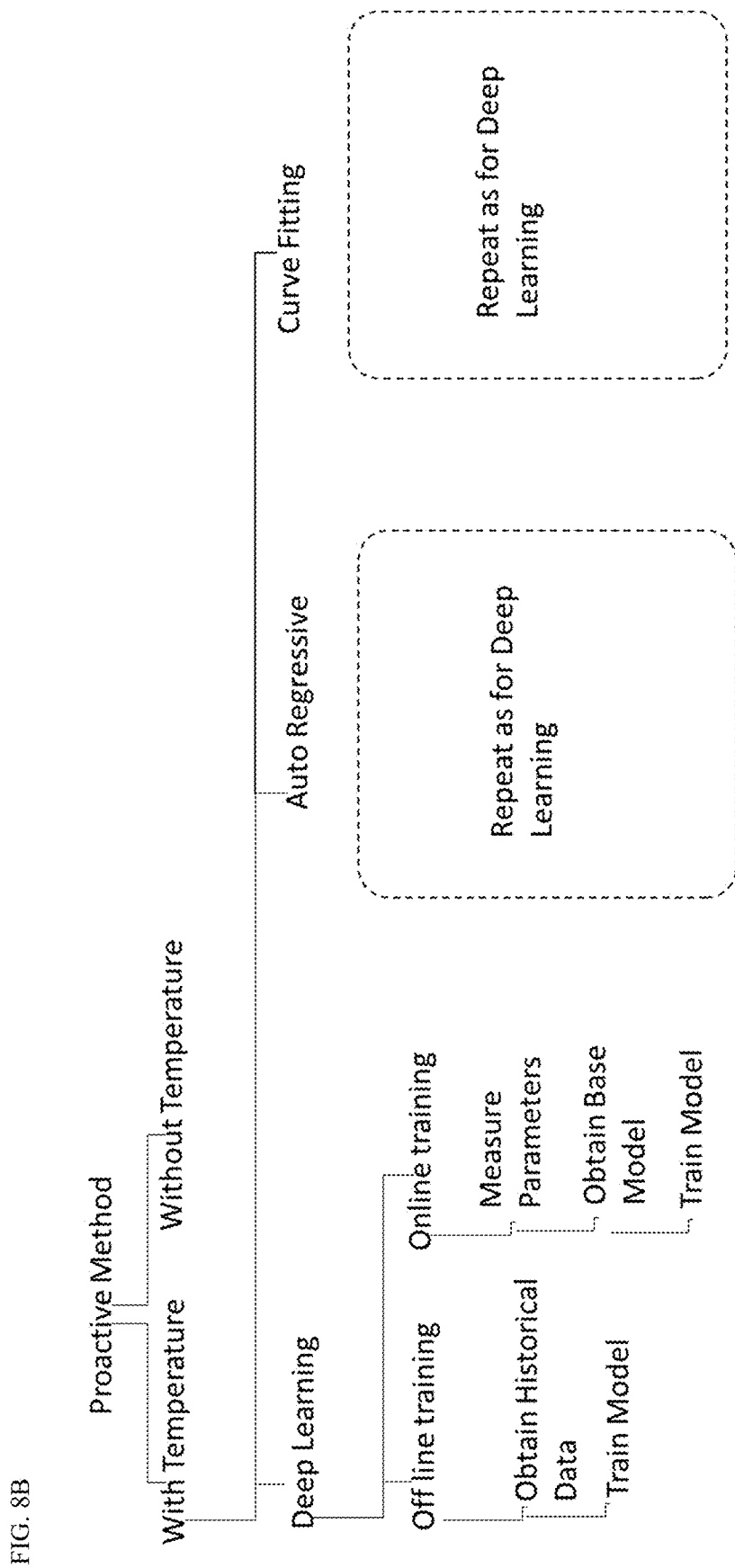
Figure 8C:
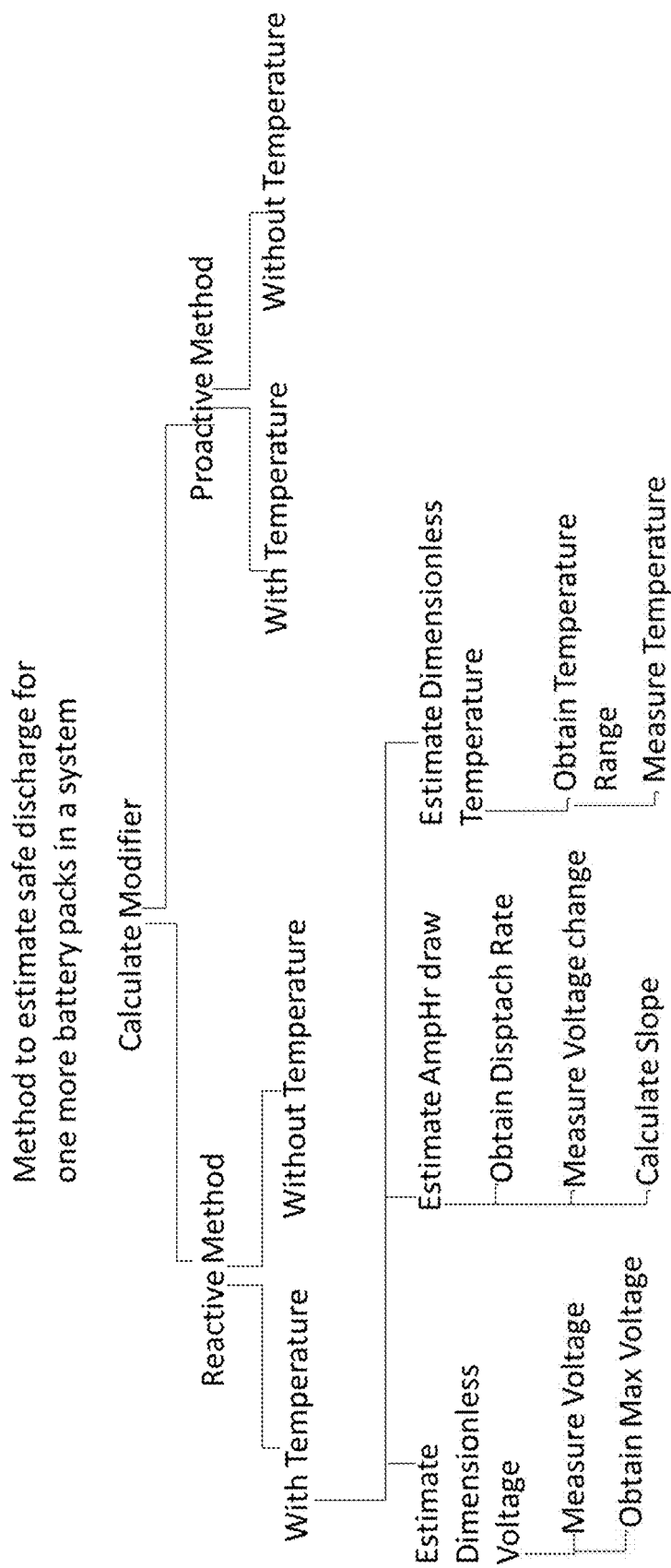

Next, the use of predictive management is detailed. Batteries degrade over time and curves can change over days/months/years as the battery packs are used in various applications. For any given pack at temperature T, undergoing a dispatch $D_i$ at voltage $V_i$, the slope $S_i$, as defined in eqn (4), is logged to create a historical profile. A multidimensional time series array of temperature, dispatch, voltage and slope [t:T:S:V:D] is created. Data from time series is converted to a time invariant 1D array comprising of Temperature, Dispatch and Voltage. A deep learning network is trained using this as input and the Slope as output. This network is used to estimate the expected value of the Slope $\hat{S}_i$ (or Amp hour draw) as shown in FIG. 8.

The slope obtained from this deep learning approach will substitute equation (4), wherever historical data is available. FIG. 7 can be modified to include this approach as shown below in FIG. 9. Further more alternate methods for estimation of slope such as auto regression based techniques like ARIMA/ARMA/ARIMAX can be used. ARIMA stands for Auto Regression Integrated Moving Average while ARIMAX stands for ARIMA with exogeneous variable like Temperature, Dispatch rate etc. In this approach current slope is defined as an algebraic function of prior values of slope, temperature, dispatch rate and voltage. A generic form of autoregressive equation can be given as follows $$\hat{S}_i = C + \varphi_1 S_{I-1} + \ldots + \varphi_p S_{I-p} - \theta_1 \varepsilon_{I-1} - \ldots - \theta_q \varepsilon_{i-q} \quad (13)$$

where S denotes the slope, while $\in$, $\theta$ and $\varphi$ denote the error and coefficients, respectively.

Figure 9:
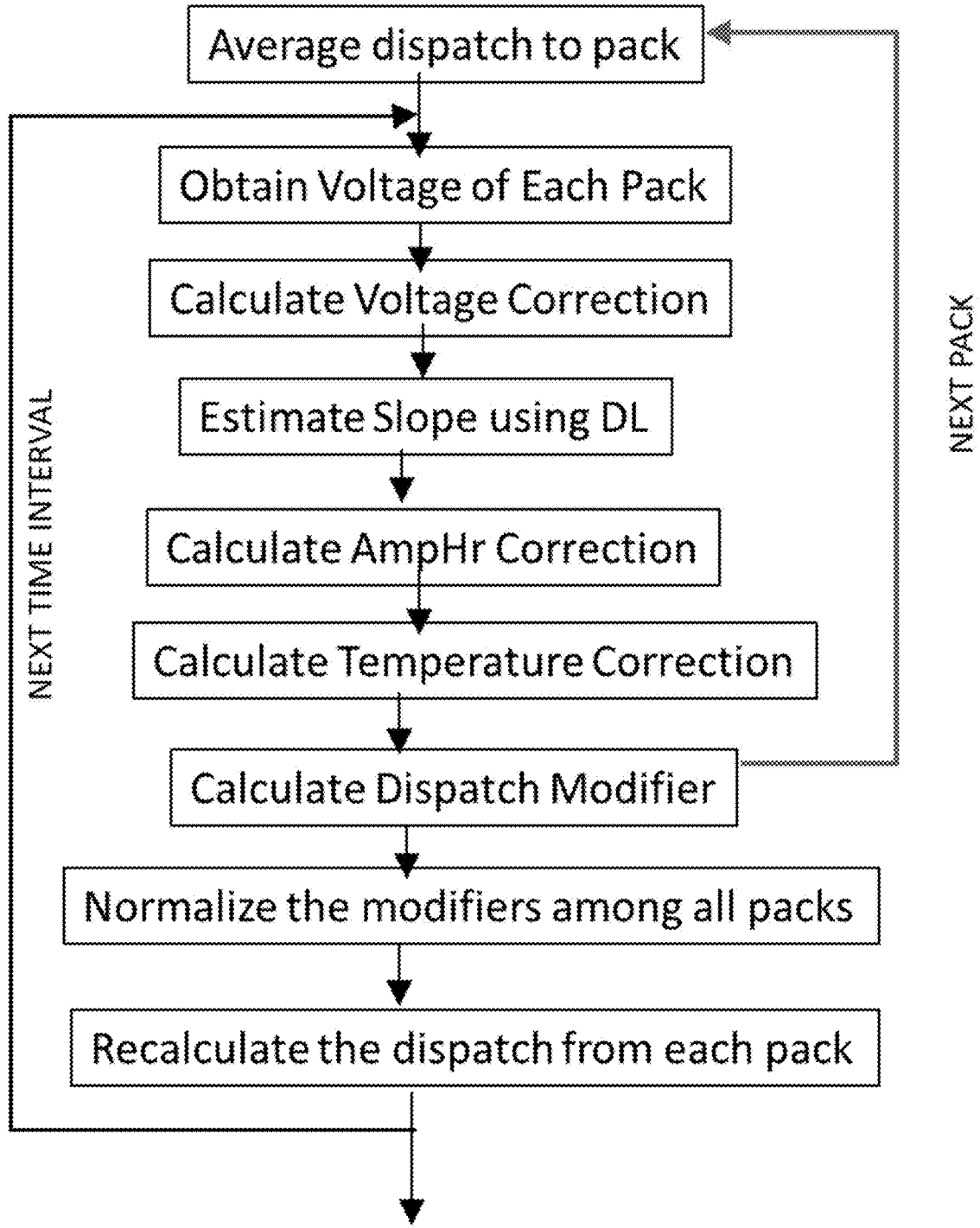
FIG. 9 shows a flow chart for an exemplary battery control system using deep learning.

Additionally, curve fitting using any multivariate polynomial of arbitrary degree can be used to model the response surface of each pack to estimate the slope for a given dispatch at a known temperature and voltage.

$$\hat{S}_i = \Sigma_{j=0}^n a_j T_i^j + \Sigma_{j=0}^m b_j V_i^j + \Sigma_{j=0}^p c_j D_i^j \quad (14)$$

where n, m and p are the order of polynomial in terms of temperature, Voltage and Dispatch while a, b and c are the respective coefficients. i is the time index, while j is the order index FIG. 9 shows an exemplary method to apply the learning machine to control the batteries. The controller runs a method for controlling packs of rechargeable batteries by:
for each pack:
determining electrical characteristics of the pack;
determining energy (AmpHr) correction for the pack;
calculating a voltage correction for the pack;
estimating the discharge slope using deep learning;
determining AmpHr correction;
determining temperature correction;
determining a dispatch modifier for the pack;
normalizing the dispatch modifiers for all packs; and
recalculating the dispatch modifiers for all packs.

Figure 10:
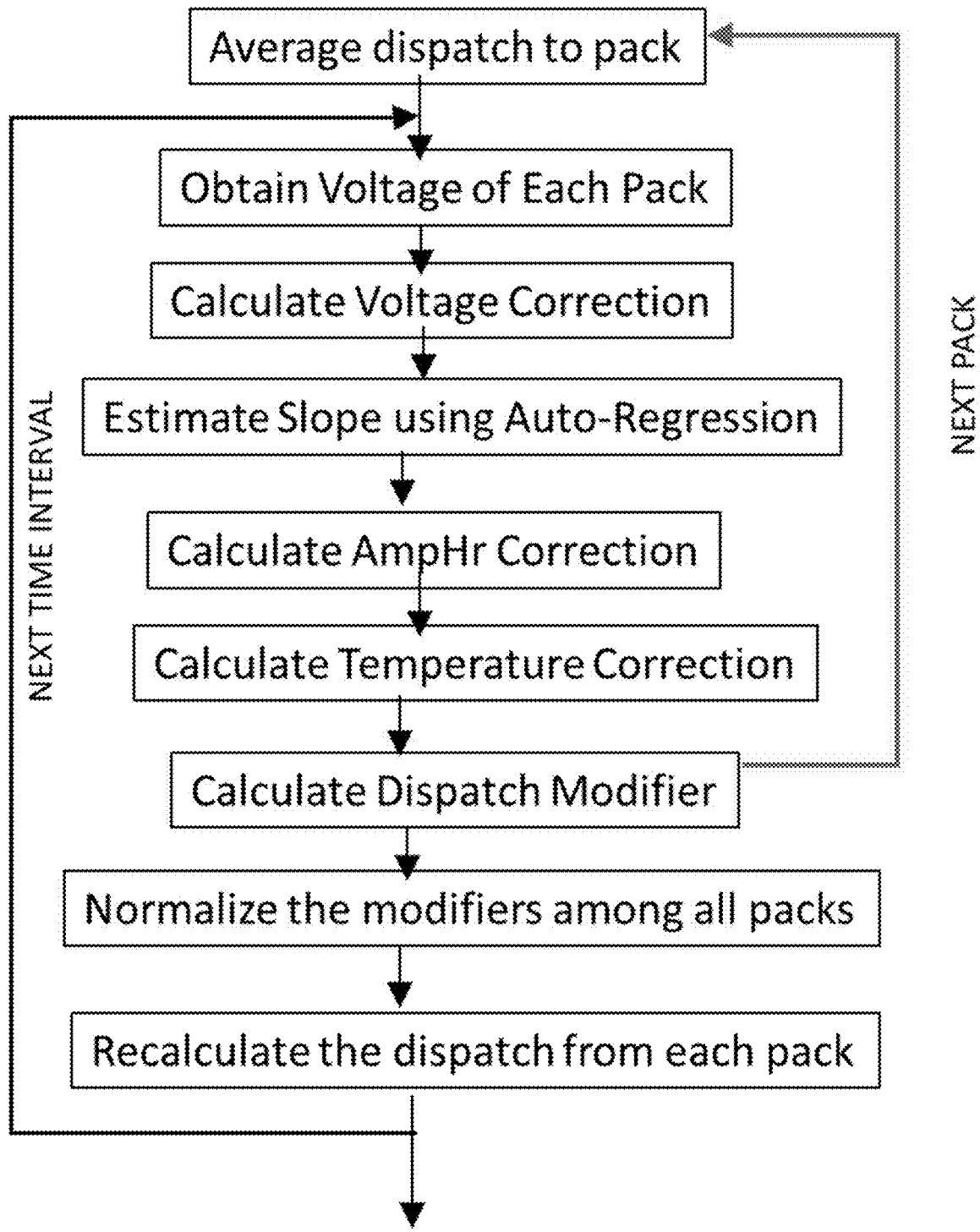
FIG. 10 shows a flow chart for an exemplary battery control system using auto-regression.

FIG. 10 shows an exemplary method to apply the learning machine to control the batteries. The controller then runs a method for controlling packs of rechargeable batteries by:
for each pack:
determining electrical characteristics of the pack;
determining energy (AmpHr) correction for the pack;
calculating a voltage correction for the pack;
estimating the discharge slope using auto-regression;
determining AmpHr correction;
determining temperature correction;
determining a dispatch modifier for the pack;
normalizing the dispatch modifiers for all packs; and
recalculating the dispatch modifiers for all packs.

Computer systems typically include at least one processor that communicates with several peripheral devices via a bus subsystem. These peripheral devices may include storage subsystems, including, for example, memory devices and file storage subsystems, user interface input devices, user interface output devices, and network interface subsystems. Input and output devices allow the user to interact with the computer system. The network interface subsystem provides an interface to an external network, including an interface to the corresponding interface device in other computer systems.

User interface input devices include keyboards and pointing devices such as mice, trackballs, touchpads, or graphics tablets, touch screens built into displays, audio input devices such as voice recognition systems and microphones, and other types. Input devices and may be included. In general, the use of the term "input device" is intended to include all possible types of devices and methods for inputting information into computer systems.

User interface output devices can include non-visual displays such as display subsystems, printers, fax machines, or audio output devices. The display subsystem may include a flat panel device such as a cathode ray tube (CRT), a liquid crystal display (LCD), a projection device, or any other mechanism for creating a visible image. The display subsystem can also provide a non-visual display such as an audio output device. In general, the use of the term "output device" is intended to include all possible types of devices and methods for outputting information from a computer system to a user or another machine or computer system.

The storage subsystem stores programming and data constructs that provide some or all of the functionality of the modules and methods described herein. These software modules are generally executed by the processor alone or in combination with other processors.

The memory used in the storage subsystem includes main random access memory (RAM) for storing instructions and data during program execution and read-only memory (ROM) for storing fixed instructions. It can contain some memory. The file storage subsystem can provide persistent storage for programs and data files, hard disk drives, floppy disk drives with associated removable media, CD-ROM drives, optical drives, or removable Media cartridges may be included. Modules that implement the functionality of some implementations may be stored by the file storage subsystem in the storage subsystem or in other machines accessible by other processors. Bus subsystems provide various components of a computer system and mechanisms for the subsystems to communicate with each other as intended. Although the bus subsystem is schematically shown as a single bus, alternative implementations of the bus subsystem can use multiple buses.

The computer system itself can be a personal computer, a portable computer, a workstation, a computer terminal, a network computer, a television, a mainframe, a server farm, a widely distributed set of loosely networked computers, or any other data processing. It can be of various types, including systems or user devices. Due to the ever-changing nature of computers and networks, the description of the computer system shown in FIG. 66 is intended only as a specific example intended to illustrate the disclosed technology. Many other configurations of computer systems are possible, with more or fewer components than the computer system mentioned thus far.

The deep learning processor can be a GPU or FPGA and may be hosted by a deep learning cloud platform such as Google Cloud Platform, Xilinx, and Cirrascale. Examples of deep learning processors include rackmount solutions such as Google's Tensor Processing Unit (TPU), GX4 Rackmount Series, and GX8 Rackmount Series, NVIDIA DGX-1, Microsoft's Stratix V FPGA, and Graphcore's Intelligent Processor Unit (IPU), Qualcomm's Zeroth platform with Snapdragon processor, NVIDIA Volta, NVIDIA DRIVE PX, NVIDIA JETSON TX1/TX2 MODULE, Intel Nirvana, Movidius VPU, Fujitsu DPI, ARM Dynamic IQ, IBM True North and more.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

What is claimed is:

1. A method for controlling packs of rechargeable batteries, comprising:
    sensing a voltage for each of the packs:
    determining if the voltage is within a predetermined range of each of the packs;
    determining a charge required to deliver a dispatch;
    determining a slope of a discharge curve from the charge using an existing or a learned V-Ah model or discharge curve;
    determining a voltage drop for the charge from the existing or learned V-Ah model or discharge curve;
    normalizing the voltage drop to a dimensionless voltage drop by dividing it by maximum allowable voltage;
    determining a modifier M based on required dispatch, the dimensionless voltage drop $(\Delta V_i)^*$ and dimensionless voltage $V_i^*$ as $M=D_i((\Delta V_i)^*)(1-V_i^*)$;
    determining a temperature deviation of each of the packs from a mean and normalizing the temperature deviation using a maximum allowable deviation;
    utilizing a normalized temperature deviation in a gaussian distribution to calculate a temperature modifier $(M_{T,i})$; and
    determining a battery dispatch signal $\hat{D}_i$ to discharge a battery using $\hat{D}_i = D_i + M(V_i, Ah_i)$
    where $D_i$ is a discharge power, V is the voltage, and $Ah_i$ is ampere-hour for pack i, wherein the modifier is used in battery discharge control.

2. The method of claim 1, further comprising providing an energy correction with power draw or ampere hour correction.

3. The method of claim 1, further comprising determining temperature correction for each of the packs.

4. The method of claim 1, further comprising applying a neural network, curve fitting, or learning machine to determine a discharge slope for at least one pack.

5. The method of claim 4, wherein data from time series is converted to a time invariant array comprising of temperature, dispatch and voltage and the neural network or learning machine is trained to generate the discharge slope as output.

6. The method of claim 1, further comprising applying an auto regression technique to estimate slope.

7. The method of claim 6, further comprising determining:

$$\hat{S}_i = C + \varphi_1 S_{i-1} + \ldots + \varphi_P S_{i-p} - \theta_1 \varepsilon_{i-1} - \ldots - \theta_q \varepsilon_{i-q}$$

where S denotes the slope, while $\in$, $\theta$ and $\varphi$ denote the error and coefficients, respectively and where C is a constant, i is a time index, and p/q are event horizons for propagation of regression and its error.

8. The method of claim 1, further comprising estimating dimensionless voltage by measuring a voltage and determining a maximum and minimum voltage.

9. A method for controlling packs of rechargeable batteries, comprising:
    sensing a current or a voltage for each of the packs:
    determining a voltage of each of the packs;
    determining a discharge power and normalizing the voltage to a dimensionless voltage by dividing the voltage by a reference voltage;
    determining a slope of a discharge curve from the voltage and the discharge curve and determining a drop in voltage from the slope and calculating a voltage correction therefrom; and
    determining a modifier for a dispatch signal and generating a battery dispatch signal $D_i$ to control a battery discharge using $\hat{D}_i = D_i + M(V_i, Ah_i)$ $$\hat{D}_i = D_i + M(V_i, Ah_i)$$

where $D_i$ is a discharge power, M is the modifier, V is the voltage, and $Ah_i$ is ampere-hour for pack i, and wherein the modifier is used in battery discharge control.

10. The method of claim 9, wherein the sensing comprises sensing voltage or current trends.

11. The method of claim 9, further comprising providing energy correction as power draw or ampere hour correction.

12. The method of claim 9, further determining temperature correction for each of the packs considering a statistical distribution.

13. The method of claim 9, further comprising determining training data.

14. The method of claim 13, further comprising performing off-line training by obtaining historical battery data and training a model therewith.

15. The method of claim 13, further comprising performing on-line training by measuring parameters from battery data, obtaining a base model, and training the base model.

16. The method of claim 1, further comprising estimating voltage by measuring a voltage and determining a maximum and minimum voltage.

17. A system, comprising:
    one or more packs of rechargeable batteries; and
    a controller coupled to the one or more packs for controlling the packs of rechargeable batteries, wherein for each of the packs the controller executes code for:
    sensing a current or voltage for each of the packs;
    determining a voltage of the battery pack;
    determining a discharge power and normalizing the voltage to a dimensionless voltage by dividing the voltage by the reference voltage;
    determining a slope of a discharge curve from the voltage and the discharge curve and determining a drop in voltage from the slope and calculating a voltage correction therefrom; and determining a modifier for a dispatch signal and generating a battery dispatch signal $\hat{D}_i$ to control a battery discharge using $$\hat{D}_i = D_i + M(V_i, Ah_i)$$

where $D_i$ is a discharge power, M is the modifier, V is the voltage, and $Ah_i$ is ampere-hour for pack i, and wherein the modifier is used in battery discharge control.

18. The system of claim 17, wherein the controller manages temperature correction for each of the packs considering a statistical distribution.

19. The system of claim 17, further comprising a neural network, a learning machine, curve-fitting method, or an auto regression method to determine a differential change in discharge for each of the packs.

* * * * *